(12) United States Patent
Templeton et al.

(10) Patent No.: US 6,603,211 B2
(45) Date of Patent: Aug. 5, 2003

(54) METHOD AND SYSTEM FOR PROVIDING A ROBUST ALIGNMENT MARK AT THIN OXIDE LAYERS

(75) Inventors: Michael K. Templeton, Atherton, CA (US); Hao Fang, Cupertino, CA (US); Maria C. Chan, San Jose, CA (US); King Wai Kelwin Ko, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 26 days.

(21) Appl. No.: 09/784,907

(22) Filed: Feb. 15, 2001

(65) Prior Publication Data

US 2002/0011678 A1 Jan. 31, 2002

Related U.S. Application Data

(60) Provisional application No. 60/182,746, filed on Feb. 16, 2000.

(51) Int. Cl.[7] .............................................. H01L 23/544
(52) U.S. Cl. ....................................................... 257/797
(58) Field of Search ................................. 257/797, 775; 438/401

(56) References Cited

U.S. PATENT DOCUMENTS

| | | | | |
|---|---|---|---|---|
| 4,338,620 A | * | 7/1982 | Kawabe ........................ 357/50 |
| 5,889,335 A | * | 3/1999 | Kuroi et al. ................. 257/797 |
| 5,893,744 A | * | 4/1999 | Wang ........................... 438/401 |
| 5,898,227 A | * | 4/1999 | Geffken et al. .............. 257/797 |
| 5,949,145 A | * | 9/1999 | Komuro ....................... 257/797 |
| 5,969,428 A | * | 10/1999 | Nomura et al. .............. 257/797 |

* cited by examiner

Primary Examiner—Carl Whitehead, Jr.
Assistant Examiner—Monica Lewis
(74) Attorney, Agent, or Firm—Sawyer Law Group LLP

(57) ABSTRACT

A method and system for providing an alignment mark for a thin layer in a semiconductor device is disclosed. The semiconductor device includes at least one alternative part having a first thickness greater than a second thickness of the thin layer. The method and system include providing the thin layer and providing the alignment mark for the thin layer in the at least one alternative part. The alignment mark has a depth that is greater than the second thickness of the thin layer. In one aspect, the method and system include providing a mask for the thin layer. The mask includes an alignment mark portion that covers the at least one alternative part and that is for providing the alignment mark. In this aspect, the method and system also include removing a portion of the at least one alternative part to provide the alignment mark in the at least one alternative part.

6 Claims, 4 Drawing Sheets

METHOD AND SYSTEM FOR PROVIDING A ROBUST ALIGNMENT MARK AT THIN OXIDE LAYERS

This application claims the benefit of Provisional application Ser. No. 60/182,746, filed Feb. 16, 2000.

FIELD OF THE INVENTION

The present invention relates to semiconductor devices, and more particularly to a method and system for making a more easily discernable alignment mark for thin layers, such as the tunnel oxide layer, in memory devices such as flash memory devices.

BACKGROUND OF THE INVENTION

Current generation semiconductor devices, such as flash memory devices, include components formed from very thin layers, such as the tunnel oxide layer that exists beneath a gate stack. In order to fabricate the semiconductor devices, subsequent layers of components must be aligned to the thin components. For example, the floating gate and control gate of a gate stack need to be aligned so as to be above the tunnel oxide layer. This can be accomplished by aligning the gate stacks with respect to a select gate oxide formed from the thin layer. In order to ensure that subsequent components are above the appropriate structures, an alignment mark for the thin layer is typically used.

FIG. 1 depicts a conventional method 10 for providing a conventional alignment mark for a thin layer, in particular a tunnel oxide layer. FIG. 1 will be described in conjunction with FIGS. 2A through 2C, which depict a portion of a conventional flash memory device 30 during fabrication. Referring to FIGS. 1 and 2A–2C, a thin oxide layer is provided on a semiconductor substrate, via step 12. FIG. 2A depicts the thin oxide layer 36 on the semiconductor substrate 32. For simplicity, the thin oxide layer 36 is depicted as a deposited oxide. However, the thin oxide layer 36 is typically thermally grown, not deposited. The thin oxide layer 36, which will be used for the select gate oxide, is typically between one hundred and two hundred Angstroms thick, and is often approximately one hundred and forty Angstroms thick. Also depicted in FIG. 2A is a field oxide region 34 that may be used to separate portions of the flash memory device 30.

A mask for the thin oxide layer is then provided, via step 14. Typically, step 14 includes spinning a layer of photoresist onto the flash memory device 30 and exposing the photoresist to print a pattern on the photoresist. FIG. 2B depicts the flash memory device 30 after step 14 has been performed. Thus, a mask 38 has been formed on the thin oxide layer 36. The mask 38 includes portions 40 and 42 that are used to mask the part of the thin oxide layer 36 that will become the select gate oxide layers. The tunnel oxide is self-aligned and will be formed in the region between the portions 40 and 42 of the mask 38, after the portion of the thin oxide layer 36 between the portions 40 and 42 of the mask 38 is removed. The mask 38 also includes a conventional alignment mark portion 44 which is above another part of the thin oxide layer 36 away from the field oxide region 34. The conventional alignment mark portion 44 of the mask 38 is used to provide the conventional alignment mark. The conventional alignment mark will be used to align subsequent masks to ensure that the gate stacks are aligned with respect to corresponding portions of the tunnel oxide layers.

The thin oxide layer 36 is then etched, via step 16. Portions of the thin oxide layer 36 exposed by the mask 38 are thus removed. The mask is then stripped, via step 18. FIG. 2C depicts the flash memory device 30 after removal of the mask 38. The select gate oxide layers 46 and 48 and the conventional alignment mark 50 remain from the thin oxide layer.

The conventional alignment mark 50 is then used to align subsequent structures to the select gate oxide layers 46 and 48, via step 20. Processing of the flash memory device 30 is then continued, via step 22. Thus, a semiconductor device, such as a flash memory device, can be fabricated.

Although the method 10 using the conventional alignment mark 50 functions, one of ordinary skill in the art will realize that alignment using the conventional alignment mark 50 is difficult. Typical alignment tools utilize the interference of light reflected off of the top and bottom interfaces of the conventional alignment mark 50 in order to locate the conventional alignment mark 50. The interference pattern depends upon the path difference between light reflecting off of the top interface of the conventional alignment mark and light reflecting off of the bottom interface of the conventional alignment mark 50. This path difference is converted into a phase difference that is given by $2nt\pi/\lambda$, where n is the index of refraction of the thin oxide layer of which the conventional alignment mark is made, t is the thickness of the conventional alignment mark, $\lambda$ is the wavelength of light used and the path differences is 2nt. There is a strong contrast (destructive interference) when the phase difference is close to $\pi$; this maximizes the difference in signal intensity between the mark (high intensity) and the background (low intensity).

Often, light having a wavelength of approximately six hundred and thirty three nanometers (six thousand three hundred and thirty Angstroms) is used. The thickness of the conventional alignment mark is determined by the thickness of the thin layer 36 and is, therefore, on the order of one hundred to two hundred Angstroms. The index of refraction for the thin layer is often not significantly greater than one (on the order of 1.4). Thus, the phase difference due to the conventional alignment mark 50 is very small. As a result, the conventional alignment mark 50 will not result in an interference pattern with a great deal of contrast. Consequently, the conventional alignment mark 50 may be difficult to use. As a result, processing is more difficult and the probability of misalignments is increased.

Accordingly, what is needed is a system and method for providing a more robust, or simpler to find, alignment mark for use with structures formed in thin layers. The present invention addresses such a need.

SUMMARY OF THE INVENTION

The present invention provides a method and system for providing an alignment mark for a thin layer in a semiconductor device. The semiconductor device includes at least one alternative part having a first thickness greater than a second thickness of the thin layer. The method and system comprise providing the thin layer and providing the alignment mark for the thin layer in the at least one alternative part. The alignment mark has a depth that is greater than the second thickness of the thin layer. In one aspect, the method and system comprise providing a mask for the thin layer. The mask includes an alignment mark portion that covers the at least one alternative part and that is for providing the alignment mark. In this aspect, the method and system also comprise removing a portion of the alternative part to provide the alignment mark in the at least one alternative part.

According to the system and method disclosed herein, the present invention provides an alignment mark which is simpler to find and which does not complicate processing of the semiconductor device.

DETAILED DESCRIPTION OF THE INVENTION

Figure 1:
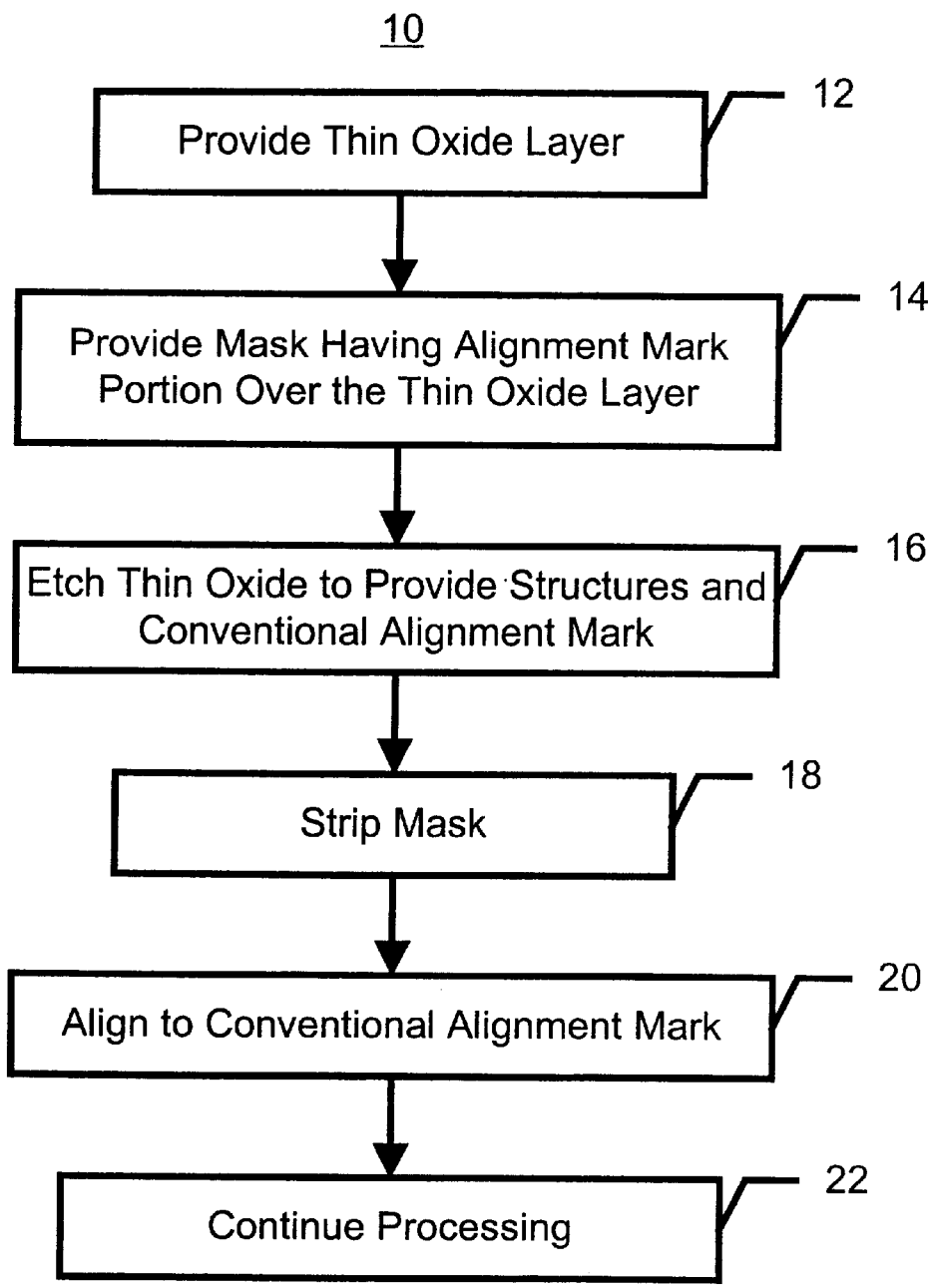
FIG. 1 is a flow chart of a conventional method for providing an alignment mark in a thin layer.
Figure 2A:
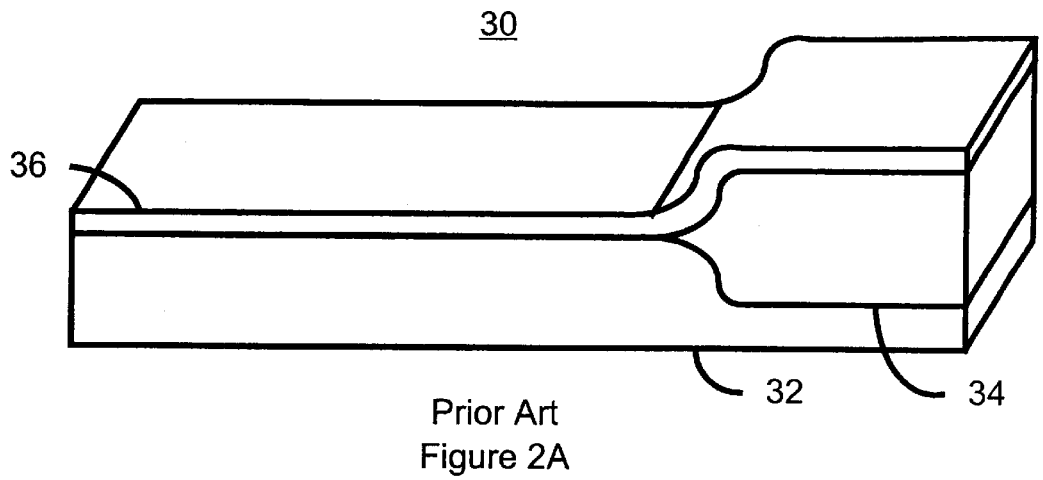
FIG. 2A is a diagram of a conventional flash memory cell during fabrication after deposition of the thin oxide layer.
Figure 2B:
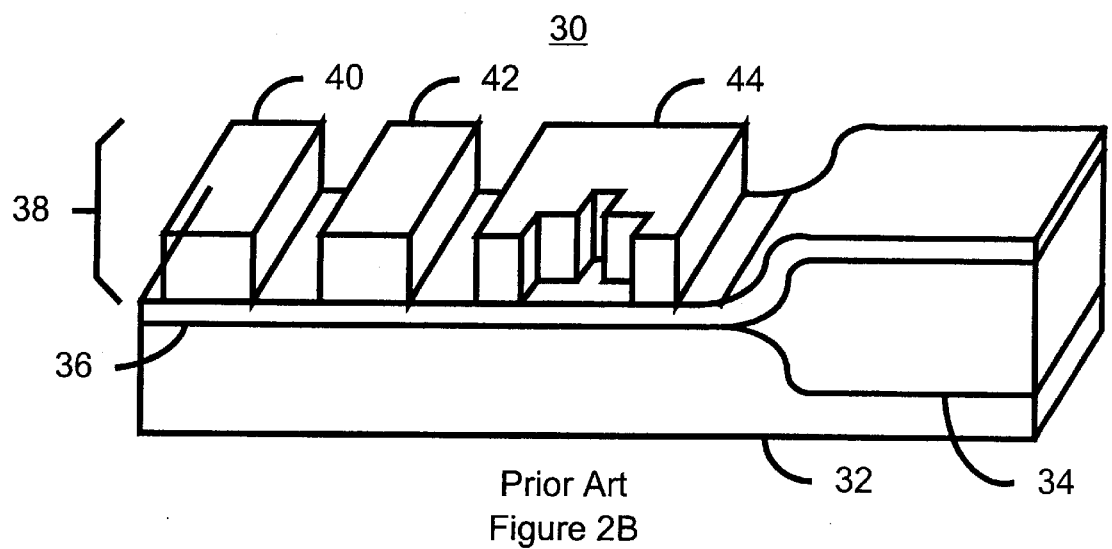
FIG. 2B is a diagram of a conventional flash memory cell during fabrication after a mask for the thin oxide layer is provided.
Figure 2C:
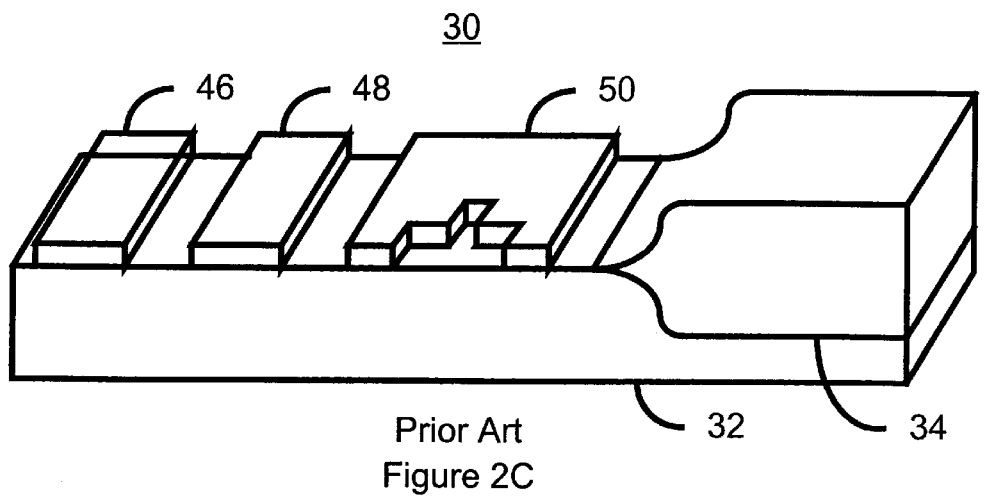
FIG. 2C is a diagram of a conventional flash memory cell during fabrication after the thin oxide layer has been etched and the alignment mark provided.

The present invention relates to an improvement in semiconductor devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Conventional semiconductor devices, such as flash memory devices, utilize thin layers to provide certain structures, such as the tunnel oxide layers of gate stacks. In order to align subsequent structures to the thin structures, conventional alignment marks for the thin layers are typically used. These conventional alignment marks are typically formed in the thin layer at the same time that other structures, such as the regions to grow the tunnel oxide layers, are formed. Using these conventional alignment marks, subsequent structures may be properly aligned.

Although semiconductor devices can be fabricated using conventional alignment marks, one of ordinary skill in the art will readily realize that it is difficult to align to conventional alignment marks. Consequently, more time and care must be spent in finding and aligning to the conventional alignment marks, misregistration between structures may be more likely to occur, adversely affecting performance or yield of the semiconductor device. Furthermore, processing may be made more difficult.

The present invention provides a method and system for providing an alignment mark for a thin layer in a semiconductor device. The semiconductor device includes at least one alternative part having a first thickness greater than a second thickness of the thin layer. The method and system comprise providing the thin layer and providing the alignment mark for the thin layer in the at least one alternative part. The alignment mark has a depth that is greater than the second thickness of the thin layer. In one aspect, the method and system comprise providing a mask for the thin layer. The mask includes an alignment mark portion that covers the at least one alternative part and that is for providing the alignment mark. In this aspect, the method and system also comprise removing a portion of the alternative part to provide the alignment mark in the at least one alternative part.

The present invention will be described in terms of providing an alignment mark for a thin oxide layer from which tunnel oxide layers are formed. However, one of ordinary skill in the art will readily recognize that this method and system will operate effectively for other thin layers used in forming other structures and for which alignment marks are used. The method and system will also be described in the context of use of a field oxide region as an alternative part. However, one of ordinary skill in the art will readily recognize the method and system are consistent with the use of another alternative part having a greater thickness than the thin layer for which the alignment mark is being provided. Although the present invention is discussed in the context of an alternate part being a field oxide region, the alternative part can be another structure including other types of isolation structures, such as shallow trench isolation structures. In addition, although disclosed in the context of particular semiconductor devices, the present invention can be utilized with other semiconductor devices and other thin film devices.

Figure 3:
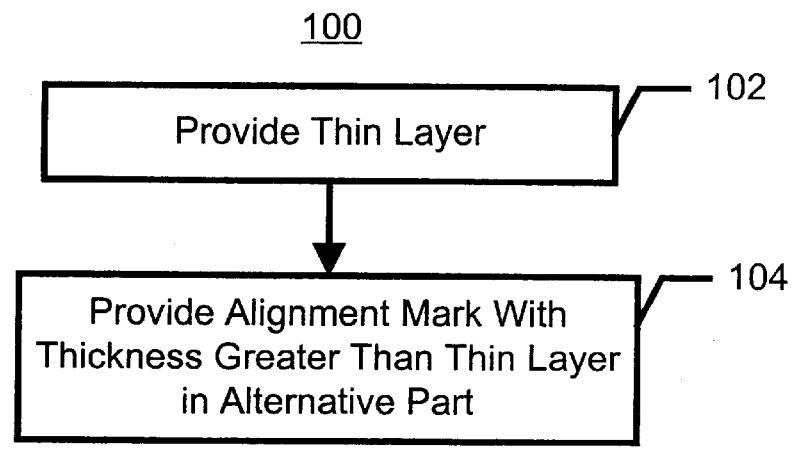
FIG. 3 is a high-level flow chart depicting one embodiment of a method in accordance with the present invention for providing a more robust alignment mark.

To more particularly illustrate the method and system in accordance with the present invention, refer now to FIG. 3, depicting a high-level flow chart of one embodiment of a method for providing an alignment mark in accordance with the present invention. A thin layer for which the alignment mark is to be used is provided, via step 102. In a preferred embodiment, the thin layer is the thin oxide layer which will be selectively removed to define the areas where the tunnel oxide layers are formed and from which select gate oxide regions will be formed. Thus, in one embodiment, the thin oxide layer is less than two hundred Angstroms thick and preferably is approximately one hundred and forty Angstroms thick. The alignment mark for the thin layer is then provided on an alternative part of the semiconductor device, via step 104. The alternative part of the semiconductor device is thicker than the thin layer. Preferably, the alternative part is at least a thousand Angstroms thick. The alignment mark provided in the alternative part is also thicker than the thin layer and preferably is at least a few hundred Angstroms thick. As discussed previously, the phase difference used in locating the alignment mark is $2\pi nt/\lambda$. In a preferred embodiment, the depth, or thickness, of the alignment mark is sufficient to provide a phase difference of close to $\pi$, allowing for destructive interference and greater ease in locating the alignment mark. The alignment mark is preferably formed in the alternative part at the same time as and using the same mask as structures that are formed in the thin layer. Also in a preferred embodiment, the alternative structure is present after the thin layer is provided.

Figure 4:
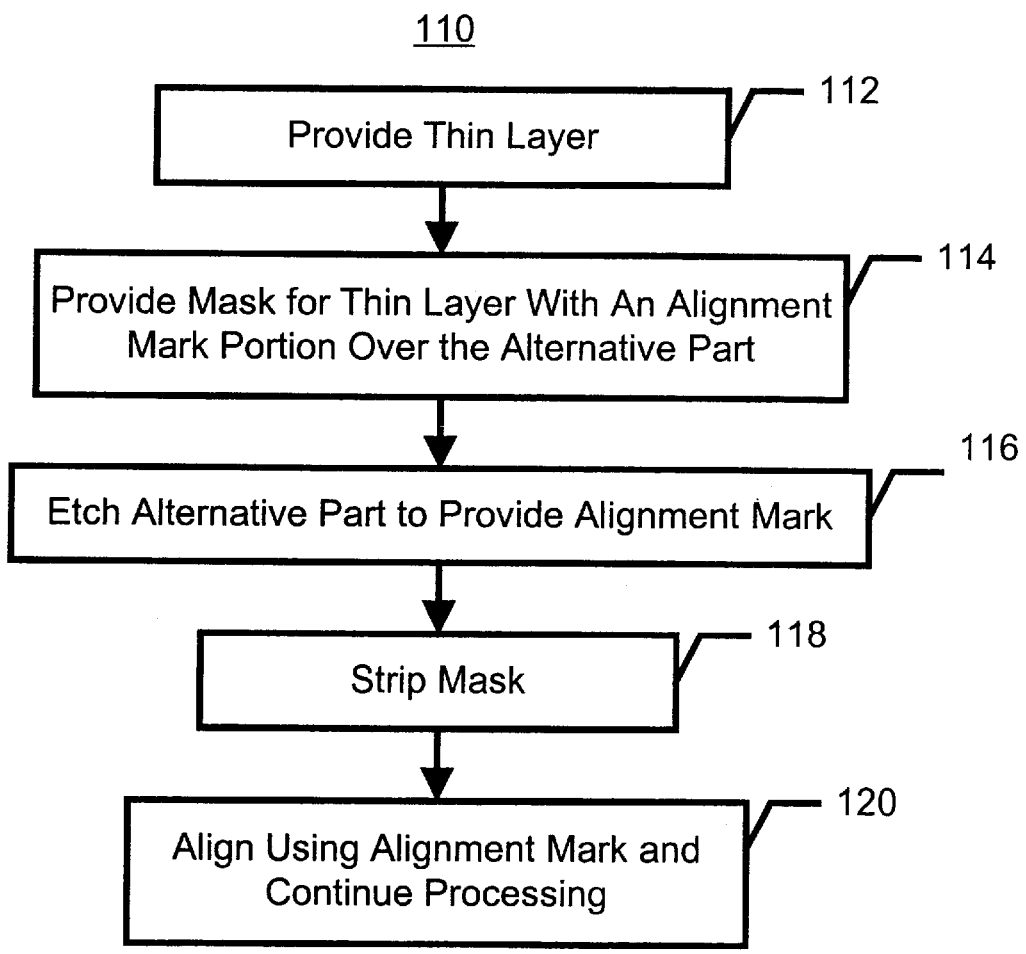
FIG. 4 is a flow chart of a preferred embodiment of a method in accordance with the present invention for providing an alignment mark.
Figure 5A:
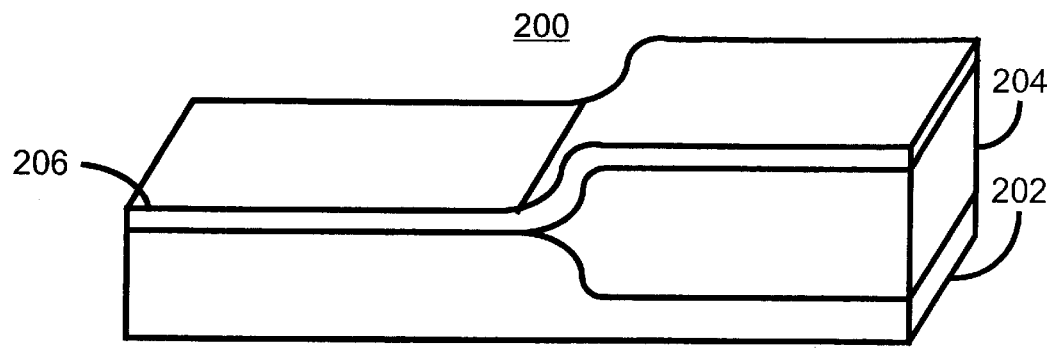
FIG. 5A is a diagram of a flash memory cell in accordance with the present invention during fabrication after the thin oxide layer has been provided.

FIG. 4 depicts a more detailed flow chart of a preferred embodiment of a method 110 for providing an alignment mark in accordance with the present invention. FIG. 4 will be explained in conjunction with FIGS. 5A through 5C, which depict a preferred embodiment of a flash memory device 200 in accordance with the present invention. Referring to FIGS. 4 and 5A, the method 100 commences after formation of field oxide 204 on the semiconductor substrate 202. The thin oxide layer is provided, via step 112. FIG. 5A depicts the flash memory device 200 after the thin oxide layer 206 has been provided. Thus, the thin oxide layer 206 covers the semiconductor substrate 202 as well as the field oxide region 204. The field oxide region is preferably several thousand Angstroms thick, while the thin oxide layer 206 is preferably approximately one hundred and forty Angstroms thick.

Figure 5B:
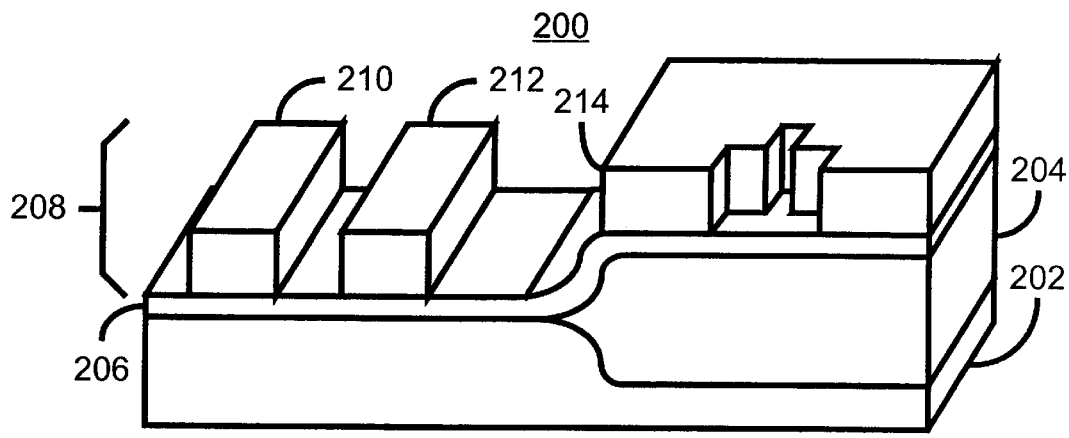
FIG. 5B is a diagram of a flash memory cell in accordance with the present invention during fabrication after a mask in accordance with the present invention has been provided.

A mask is then provided for the thin oxide layer 206, via step 114. Preferably, the mask 208 is formed by spinning a layer of photoresist onto the thin oxide layer 206 and exposing the photoresist to print the desired pattern. FIG. 5B depicts the flash memory device after the mask 208 has been provided. The mask 208 includes portions 210 and 212 for the structures in the thin oxide, as well as an alignment mark portion 214. The alignment mark portion 214 is over the alternative part which, in the preferred embodiment, is the field oxide region 204. Thus, the mask 208 defines the portions of the thin oxide layer 206 that will become the select gate oxide layers (under portions 210 and 212 of the mask 208) and the regions that will become the tunnel oxide layer (between portions 210 and 212 of the mask 208). The mask 208 also determines the alternative part (the field oxide region 204) in which the alignment mark will be formed.

The field oxide region 204 is then etched to provide the alignment mark, via step 116. Preferably, step 116 also includes etching the thin oxide layer 206 to provide the structures therein. The field oxide region 204 is etched in step 116 such that the alignment mark is thicker than the thin oxide layer 208. Preferably, the alignment mark is thick enough to provide a significant contrast for the desired wavelength of light. In a preferred embodiment, the depth, or thickness, of the alignment mark is sufficient to provide a phase difference of close to $\pi$, allowing for destructive interference and greater ease in locating the alignment mark.

Figure 5C:
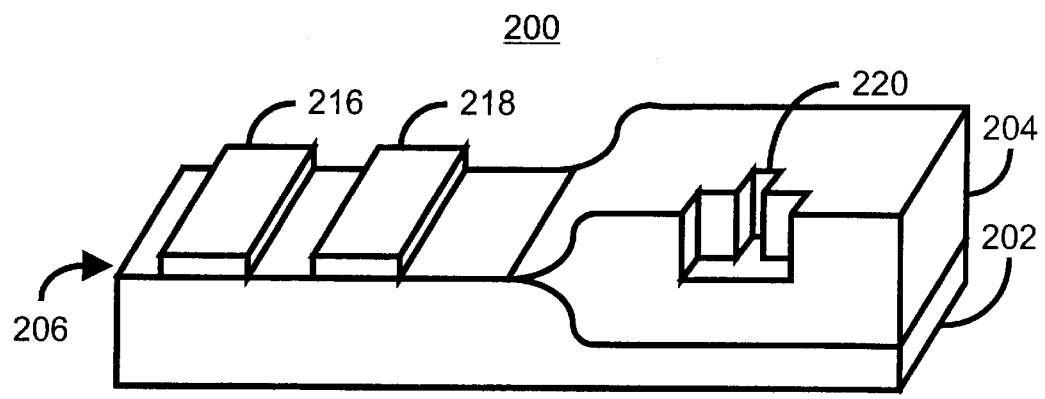
FIG. 5C is a diagram of a flash memory cell in accordance with the present invention during fabrication after an alignment mark in accordance with the present invention has been provided.

The mask 204 is then stripped, via step 118. FIG. 5C depicts the flash memory device 200 after the mask 208 has been stripped. Select gate oxide layers 216 and 218 have been formed from the thin oxide layer 206. Furthermore, an alignment mark 220 has been formed in the field oxide region 204. The alignment mark 220 is thicker than the select gate oxide layers 216 and 218. As discussed above, the alignment mark is preferably thick enough to provide sufficient contrast for the wavelength of light used to locate the alignment mark. Thus, the alignment mark 220 is preferably thick enough to provide a phase difference of close to $\pi$. Once the alignment mark 220 and select gate oxide layers 216 and 218 are formed and the mask 208 stripped, the alignment mark 220 can be aligned to using conventional tools and fabrication of the flash memory device 200 completed, via step 120.

The alignment mark fabricated using the method 100 or 110 is located on an alternative part, rather than being part of the thin layer itself. The alternative part is thicker than the thin layer. Thus, the alignment mark is thicker than the thin layer. Consequently, when conventional alignment tools are used to locate the mark, the alignment mark can provide greater contrast, or more destructive interference, for a given wavelength of light. Thus, the alignment mark fabricated using the method 100 or 110 can be more easily and accurately located. The probability that structures within the semiconductor will be misaligned is thereby decreased. Furthermore, fabrication of semiconductor devices using the method 100 or 110 is thereby simplified.

A method and system has been disclosed for providing an alignment mark which is more easily located. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A semiconductor device comprising:
    at least one alternative part having a first thickness;
    a thin layer having second thickness less than the first thickness of the at least one alternative part;
    an alignment mark for the thin layer in the at least one alternative part, the alignment mark having a depth, the depth being greater than the second thickness of the thin layer;
    wherein the depth of the alignment mark is also less than the first thickness of the at least one alternative part.

2. The semiconductor device of claim 1 wherein the thin layer is an oxide layer.

3. The semiconductor device of claim 2 wherein the thin layer is a select gate oxide layer.

4. The semiconductor device of claim 1 wherein the at least one alternative part is at least one field oxide region.

5. The semiconductor device of claim 1 wherein the at least one alternative part is at least one shallow trench isolation region.

6. The semiconductor device of claim 1 wherein the alignment mark is provided during removal of a portion of the thin layer.

* * * * *